US012635416B2

(12) United States Patent
Bartasyte et al.

(10) Patent No.: US 12,635,416 B2
(45) Date of Patent: May 19, 2026

(54) LAYERED SOLID STATE ELEMENT COMPRISING A FERROELECTRIC LAYER AND METHOD FOR MANUFACTURING THE SAME

(71) Applicant: UNIVERSITE DE FRANCHE COMTE, Besancon (FR)

(72) Inventors: Ausrine Bartasyte, Chatillon le Duc (FR); Sabina Kuprenaite, Besancon (FR); Vincent Astié, Besancon (FR)

(73) Assignee: UNIVERSITE DE FRANCHE COMTE, Besancon (FR)

( * ) Notice: Subject to any disclaimer, the term of this patent is extended or adjusted under 35 U.S.C. 154(b) by 839 days.

(21) Appl. No.: 18/007,545

(22) PCT Filed: May 28, 2021

(86) PCT No.: PCT/EP2021/064393
§ 371 (c)(1),
(2) Date: Dec. 1, 2022

(87) PCT Pub. No.: WO2021/244978
PCT Pub. Date: Dec. 9, 2021

(65) Prior Publication Data
US 2023/0200246 A1    Jun. 22, 2023

(30) Foreign Application Priority Data
Jun. 2, 2020    (EP) ..................................... 20305575

(51) Int. Cl.
*H10N 30/00*    (2023.01)
*C30B 23/02*    (2006.01)
(Continued)

(52) U.S. Cl.
CPC ......... *H10N 30/708* (2024.05); *C30B 23/025* (2013.01); *C30B 25/18* (2013.01);
(Continued)

(58) Field of Classification Search
CPC .. H10N 30/708; H10N 30/045; H10N 30/076; H10N 30/079; H10N 30/8542;
(Continued)

(56) References Cited

U.S. PATENT DOCUMENTS

2006/0138906 A1    6/2006    Iwashita et al.
2008/0278038 A1    11/2008    Kobayashi et al.
(Continued)

FOREIGN PATENT DOCUMENTS

JP    2013118252 A    6/2013

OTHER PUBLICATIONS

International Search Report and written opinion mailed on Nov. 23, 2021, in corresponding International Application PCT/EP2021/064393, 21 pages.
(Continued)

*Primary Examiner* — Jorge L Salazar, Jr.
(74) *Attorney, Agent, or Firm* — Maier & Maier, PLLC

(57)    ABSTRACT
A layered solid element includes a ferroelectric layer of a crystalline material $Li_{1-x}(Nb_{1-y}Ta_y)_{1+x}O_{3+2x-z}$ which has X- or 33°Y-orientation with respect to a substrate of the layered solid element. The ferroelectric layer is grown epitaxially from a buffer layer having of one of the chemical formulae $L_kNi_rO_{1.5\cdot(k+r)+w}$ or $L_{n+1}Ni_nO_{3n+1+\delta}$, where L is a lanthanide element. Such layered solid element may form a thin-film bulk acoustic resonator and be useful for integrated electronic circuits such as RF-filters, or guided optical devices such as integrated optical modulators.

15 Claims, 4 Drawing Sheets

(51) Int. Cl.

| | |
|---|---|
| *C30B 25/18* | (2006.01) |
| *C30B 29/30* | (2006.01) |
| *C30B 29/68* | (2006.01) |
| *G02F 1/05* | (2006.01) |
| *H03H 3/02* | (2006.01) |
| *H03H 9/02* | (2006.01) |
| *H03H 9/17* | (2006.01) |
| *H10N 30/045* | (2023.01) |
| *H10N 30/076* | (2023.01) |
| *H10N 30/079* | (2023.01) |
| *H10N 30/853* | (2023.01) |

(52) U.S. Cl.

CPC .............. *C30B 29/30* (2013.01); *C30B 29/68* (2013.01); *G02F 1/05* (2013.01); *H03H 3/02* (2013.01); *H03H 9/02031* (2013.01); *H03H 9/02102* (2013.01); *H03H 9/173* (2013.01); *H03H 9/175* (2013.01); *H03H 9/176* (2013.01); *H10N 30/045* (2023.02); *H10N 30/076* (2023.02); *H10N 30/079* (2023.02); *H10N 30/8542* (2023.02); *G02F 2201/07* (2013.01); *G02F 2202/20* (2013.01)

(58) Field of Classification Search

CPC ....... C30B 23/025; C30B 25/18; C30B 29/30; C30B 29/68; G02F 1/05; G02F 2201/07; G02F 2202/20; G02F 1/11; H03H 3/02; H03H 9/02031; H03H 9/02102; H03H 9/173; H03H 9/175; H03H 9/176; H03H 9/02078; H03H 2003/021; H03H 2003/022; H03H 2003/025

USPC ................................................. 333/186–188

See application file for complete search history.

(56) References Cited

U.S. PATENT DOCUMENTS

| | | |
|---|---|---|
| 2010/0020133 A1 | 1/2010 | Ohashi et al. |
| 2011/0141200 A1 | 6/2011 | Osawa et al. |
| 2021/0305485 A1* | 9/2021 | Morishita ........... H10N 30/076 |

OTHER PUBLICATIONS

Bartasyte et al.,"Toward High-Quality Epitaxial LiNbO3 and LiTaO3 Thin Films for Acoustic and Optical Applications", Advanced Materials Interfaces, vol. 4, No. 8, Apr. 1, 2017, 37 pages.

Yin et al.,"(0 1 2)-oriented growth of the films LaNiO3/SiO2/Si(1 1 1) by pulsed laser deposition", Journal of Materials Science, vol. 33, Dec. 31, 1998, 5 pages.

Asakawa et al.,"Analysis of Longitudinal Leaky SAW on LiNbO3 Thin Plate/Amorphous Layer/Quartz Structure", 2019 IEEE International Ultrasonics Symposium (IUS), IEEE, Oct. 6, 2019, 4 pages.

Hayashi et al.,"Longitudinal Leaky Surface Acoustic Wave with Low Attenuation on LiTaO3 Thin Plate Bonded to Quartz Substrate", 2018 IEEE International Ultrasonics Symposium (IUS), IEEE, Oct. 22, 2018, 4 pages.

Faucheux et al.,"Structural study of lanthanum nickelate thin films deposited on different single crystal substrates", Journal of Solid State Chemistry, Orlando, FL, US, vol. 177, No. 12, Dec. 1, 2004, 10 pages.

* cited by examiner

LAYERED SOLID STATE ELEMENT COMPRISING A FERROELECTRIC LAYER AND METHOD FOR MANUFACTURING THE SAME

FIELD

The invention relates to a layered solid element that comprises a ferroelectric layer, and to a method for manufacturing such element.

BACKGROUND

Lithium niobate and lithium tantalate with respective chemical formulae $Li_{1-x}Nb_{1+x}O_{3+2x}$ and $Li_{1-x}Ta_{1+x}O_{3+2x}$, frequently described in simplified formula as $LiNbO_3$ or $LiTaO_3$, respectively, are ferroelectric materials which are useful for many applications in microelectronics, microacoustics, pyroelectric devices, and guided photonics. In particular, they are used for producing RF-filters such as implemented in communication terminals. However, layers of $LiNbO_3$ or $LiTaO_3$ are produced up to now mainly on dielectric sapphire substrates, so that they can only be used for implementing surface acoustic waves (SAW). Then, there is a challenge to produce at low cost films of $LiNbO_3$ or $LiTaO_3$ on bottom electrodes and/or especially on structures that include sacrificial layers or acoustic mirrors and that are based on silicon (Si) substrates, so that these $LiNbO_3$— or $LiTaO_3$ films can be used for implementing bulk acoustic waves (BAW). Indeed, RF-filters based on BAW have better ability to withstand high power densities. Thus, they are more suitable for operation at high frequencies than SAW filters. BAW filters that use such $LiNbO_3$— or $LiTaO_3$ films offer high electromechanical coupling and can be operated for frequencies higher than filters based on standard aluminium nitride (AlN) films, or can constitute wide-band or frequency-tuneable filters.

It has been reported to manufacture $LiNbO_3$-based resonators by cutting slices of a $LiNbO_3$ single-crystal wafer and bonding such slices to suitable circuit structures. The slice thickness can be low enough using such method for obtaining resonators based on bulk acoustic waves generated in the $LiNbO_3$ slices. But realisation of RF-filters operating around 6 GHz (gigahertz) requires very thin films, with thickness around 200 nm (nanometer), which are difficult to fabricate by this wafer-cutting method. Moreover such method further involves slice transfer, which makes it expensive and impossible to implement for mass production at low cost.

Starting from this situation, one object of the present invention consists in providing low-cost high-coupling ferroelectric films that are suitable for implementing bulk acoustic waves.

Another object of the invention consists in producing ferroelectric films with well-controlled thickness values, and/or that are free of defects such as cracks and delaminations.

Another object of the invention consists in producing ferroelectric films with well-controlled chemical composition values, with precision better or equal to 0.2 mol %.

Still another object of the invention is providing ferroelectric films in a form that can be integrated with electronic circuits, acoustic devices, electro-optic devices, pyroelectric devices, or guided photonic devices.

SUMMARY

For meeting at least one of these objects or others, a first aspect of the present invention proposes a layered solid element that comprises a substrate and a layer stack supported by a face of the substrate. The layer stack comprises a buffer layer of a first crystalline material and a ferroelectric layer of a second crystalline material which are in direct contact with one another along an epitaxial interface. The buffer layer is closer to the substrate than the ferroelectric layer.

The first crystalline material is based on a first compound with chemical formula $L_kNi_rO_{1.5 \cdot (k+r)+w}$, where L is a lanthanide element or several lanthanide elements substituted to one another within the first crystalline material, Ni is nickel and O is oxygen. k is a first coefficient comprised between 0.7 and 1.3, and r is a second coefficient comprised between 0.7 and 1.3. w is a third coefficient that quantifies an amount of lacking or excessing (interstitial) oxygen atoms, and is comprised between $-0.5$ and $+0.5$. Values k=1, r=1 and w=0) correspond to stoichiometric nickelate of lanthanides, i.e. $LNiO_3$.

The first crystalline material with chemical formula $L_kNi_rO_{1.5 \cdot (k+r) \cdot w}$ is of trigonal crystal system.

Alternatively, but also comprised in the invention, the first crystalline material may be based on another first with compound chemical formula $L_{n+1}Ni_nO_{3n+1+\delta}$, where n is a non-zero integer, and $\delta$ is a coefficient comprised between $-0.5$ and $+0.5$. L is again a lanthanide element or several lanthanide elements substituted to one another within the so-called another first crystalline material, Ni is nickel and O is oxygen.

The another first crystalline material with chemical formula $L_{n+1}Ni_nO_{3n+1+\delta}$ is of tetragonal or orthorhombic crystal system with lattice dimensions similar to those of hexagonal cell of trigonal $L_kNi_rO_{1.5 \cdot (k+r)+w}$. Such crystalline $L_{n+1}Ni_nO_{3n+1+\delta}$ material is a Ruddlesden-Popper phase.

The second crystalline material is based on lithium niobate, lithium tantalate or a second compound with chemical formula $Li_{1-x}(Nb_{1-y}Ta_y)_{1+x}O_{3+2x-z}$, where Li is lithium, Nb is niobium, Ta is tantalum, x is another first coefficient comprised between 0 and 0.08, y is another second coefficient comprised between 0 and 1, and z is another third coefficient comprised between 0 and $+0.5$. Values x=0, y=0 and z=0 correspond to stoichiometric lithium niobate $LiNbO_3$, x=0, y=1 and z=0 correspond to stoichiometric lithium tantalate $LiTaO_3$, and more generally y denotes the ratio of niobium cations which are substituted to tantalum cations with respect to lithium niobate $LiNbO_3$. x quantifies an amount of lithium oxide $Li_2O$ which is lacking with respect to the composition $LiNb_{1-y}Ta_yO_3$ while maintaining the crystal structure of this latter almost identical. 2x quantifies supplementary oxygen atoms used to compensate positive charges of defects created by replacement of $Li^+$ ions by $Nb^{5+}$ or $Ta^{5+}$ ions, and z quantifies an amount of lacking oxygen atoms.

It is further possible for the first, another first and second crystalline materials to contain doping amounts of another chemical element, from the above-cited chemical formulae and again without significantly modifying the crystal structures.

Thanks to the layered structure of the invention element, the materials can be deposited on the substrate using deposition processes that are available to industrial manufacturers, in particular integrated circuit manufacturers acting in microelectronics, microacoustics or guided photonics. Such processes allow good or very good control of the film thicknesses as well as the material composition and quality, so that the films obtained using these processes may be well crystallized, almost defect-free and with good adhesion throughout the layer stack. In particular, low thickness values that can be achieved using these processes allow using the ferroelectric layer for implementing bulk acoustic waves with high frequencies, in particular above 5 GHz.

The invention layered solid element may form part of an integrated electronic circuit, such as a RF-filter, or part of an integrated acoustic device, or part of an integrated guided photonic device, or part of a pyroelectric device. A RF-filter obtained in this way can have higher resonance frequency and wider bandwidth than those of standard filters. It can be produced at industrial level, and be based on surface acoustic waves or based on bulk acoustic waves. It can also be of wide-band filter type or frequency-tuneable filter type, as useful for new generation communication terminals.

In addition, having an epitaxial interface between the buffer layer and the ferroelectric layer makes it possible to select a desired crystal orientation for the ferroelectric layer with respect to the substrate, so that the ferroelectric coupling efficiency is increased or maximized. The compounds with chemical formula $L_kNi_rO_{1.5\cdot(k+r)+w}$ for the buffer layer are suitable for being produced with crystal structure of R-3c space group, and with controlled crystal orientation. The compounds with chemical formula $L_{n+1}Ni_nO_{3n+1+\delta}$ for the buffer layer are suitable for being produced with crystal structure of Ruddlesden-Popper phases, i.e. tetragonal (I4/mmm or F4/mmm space group) or orthorhombic (Bmab or F/mmm space group) structure, depending on the synthesis conditions and oxygen content in the material, and also with controlled crystal orientation. One may note that in literature there is no general agreement on the phase diagram and existing phases of this material and even monoclinic structures of $L_{n+1}Ni_nO_{3n+1+\delta}$ compound were reported. Then, such crystal orientations of the buffer layer allow the material of the ferroelectric layer to be crystalline as-deposited, with a desired crystal orientation for this ferroelectric layer that is set by the crystal orientation of the buffer layer.

The second crystalline material, of the ferroelectric layer, may be of ilmenite structure with trigonal structure. In such case, the buffer layer of the first crystalline material when based on $L_kNi_rO_{1.5\cdot(k+r)+w}$ with trigonal structure may have a crystallographic plane (0, 1, −1, 2) in hexagonal setting that is parallel to the epitaxial interface, and the second crystalline material within the ferroelectric layer may be oriented (0, 1, −1, 2) with respect to the epitaxial interface. As it is known by the Man skilled in solid materials, the crystallographic plane (0, 1, −1, 2) in hexagonal setting for crystalline $L_kNi_rO_{1.5\cdot(k+r)+w}$ corresponds to 36°±5° Y orientation in IEEE convention. Similarly, the epitaxial interface being parallel to the (0, 1, −1, 2) R-plane of the ferroelectric layer in hexagonal setting means that this ferroelectric layer is oriented 33°±5° Y in IEEE convention.

Alternatively, again when the second crystalline material of the ferroelectric layer is of ilmenite structure with trigonal structure, the buffer layer of the first crystalline material when based on $L_kNi_rO_{1.5\cdot(k+r)+w}$ with trigonal structure may have a crystallographic plane (1, 1, −2, 0) in hexagonal setting that is parallel to the epitaxial interface, and the second crystalline material within the ferroelectric layer may have a crystallographic X-axis that is oriented perpendicular to the epitaxial interface in IEEE convention. The crystallographic plane (1, 1, −2, 0) in hexagonal setting is perpendicular to X axis in IEEE convention. Similarly, the second crystalline material within the ferroelectric layer having its crystallographic X-axis oriented perpendicular to the epitaxial interface in IEEE convention means that the epitaxial interface is parallel to the (2, −1, −1, 0) A-plane in hexagonal setting.

Again when the second crystalline material, of the ferroelectric layer, is of ilmenite structure with trigonal structure, the buffer layer of the first crystalline material when based on $L_{n+1}Ni_nO_{3n+1+\delta}$ with tetragonal or orthorhombic structure may have a crystallographic plane (0, 0, 1) that is parallel to the epitaxial interface, and the second crystalline material within the ferroelectric layer may be oriented (0, 1, −1, 2) with respect to the epitaxial interface, i.e. oriented 33°±5° Y in IEEE convention with respect to said epitaxial interface.

Alternatively, again when the second crystalline material of the ferroelectric layer is of ilmenite structure with trigonal structure, the buffer layer of the first crystalline material when based on $L_{n+1}Ni_nO_{3n+1+\delta}$ with tetragonal or orthorhombic structure may have a crystallographic plane (1, 1, 0) that is parallel to the epitaxial interface, and the second crystalline material within the ferroelectric layer may have a crystallographic X-axis that is oriented perpendicular to the epitaxial interface in IEEE convention.

In various embodiments of the invention, one or several of the following additional features may be further reproduced, for additional advantages such as better quality or reliability of the invention element, or for intended applications of this element:

the buffer layer may have a first thickness of between 1 nm (nanometer) and 1000 nm, when this first thickness is measured perpendicular to the epitaxial interface;

the ferroelectric layer may have a second thickness of between 10 nm to 2000 nm, when this second thickness is also measured perpendicular to the epitaxial interface;

the substrate may be a silicon-based substrate or a substrate designed for an integrated optical or acoustical device. In particular, the substrate may be single-crystal silicon with (100)-orientation;

the layer stack may further comprise at least one among a silica layer, a titanium layer, a titania layer, a tantalum layer, a tantalum oxide layer, a chromium layer, a chromium oxide layer, an electrode layer, a sacrificial layer adapted to be selectively etched, for example by wet or dry etching, and a Bragg mirror, between the substrate and the buffer layer. When the electrode layer is a bottom electrode layer, a material of such bottom electrode layer may be selected among platinum, iridium, ruthenium or an electrically conducting oxide. When the electrode layer is a top electrode layer, a material of such top electrode layer may be any metal;

a cavity may be located between a first part of the layered solid element which comprises the substrate, and a second part of the layered solid element which comprises the buffer layer and the ferroelectric layer; and the ferroelectric layer may be located between two electrode layers within the layer stack, along a direction perpendicular to the layers, so that the layered solid element is adapted to implement bulk acoustic waves or optical variations that are generated within the ferroelectric layer by a time-varying voltage applied between these electrode layers.

Generally, the layered solid element may be adapted for forming a high overtone bulk acoustic resonator, commonly denoted HBAR.

Alternatively, the layered solid element may be adapted for forming a thin-film bulk acoustic resonator of free-standing type, commonly denoted TFBAR.

Alternatively again, the layered solid element may be of solidly mounted resonator type, known as SMR.

A second aspect of the invention proposes a method for manufacturing a layered solid element that is in accordance with the first invention aspect. According to such manufacturing method, the second crystalline material is grown epitaxially from the buffer layer of the first crystalline material or of the so-called another first crystalline material, for forming the ferroelectric layer.

The first crystalline material may be deposited using any known deposition process, including chemical processes, sol-gel processes, physical deposition processes such as pulsed laser deposition or atomic layer deposition. But using a RF-sputtering deposition process or a chemical vapour deposition process for forming the buffer layer may be advantageous. In particular, RF-sputtering allows obtaining the first crystalline material, that of the buffer layer, directly based on $L_kNi_rO_{1.5 \cdot (k+r)+w}$ with crystallographic plane (0, 1, -1, 2) parallel to the substrate face or based on $L_{n+1}Ni_n O_{3n+1+\delta}$ with crystallographic plane (0, 0, 1) parallel to the substrate face. Then, the second crystalline material, that of the ferroelectric layer, grows epitaxially with the 33°Y-orientation on the buffer layer. Alternatively, using a chemical vapour deposition process for forming the buffer layer leads to obtaining the first crystalline material based on $L_kNi_rO_{1.5 \cdot (k+r)+w}$ with crystallographic plane (1, 1, -2, 0) parallel to the substrate face, or based on $L_{n+1}Ni_nO_{3n+1+\delta}$ with crystallographic plane (1, 1, 0)) parallel to the substrate face. Then, the second crystalline material, that of the ferroelectric layer, grows epitaxially with its crystallographic X-axis perpendicular to the epitaxial interface, on the buffer layer.

The second crystalline material may also be deposited using any known deposition process as listed above. But it may be advantageous using a chemical vapour deposition process for forming the ferroelectric layer, in particular a direct-liquid-injection chemical vapour deposition process or a pulsed-injection chemical vapour deposition process.

Possibly, the invention process may further comprise applying an electrical field to the second crystalline material when this second crystalline material is being deposited for forming the ferroelectric layer, or after the second crystalline material has been deposited. Such electrical field may be suitable for aligning ferroelectric orientations which exist in domains within the ferroelectric layer.

A third aspect of the invention proposes an integrated circuit which comprises a layered solid element that is in accordance with the first invention aspect. The integrated circuit may form at least part of an electronic device, or at least part of acoustic device, in particular of a microacoustic device, at least part of an electro-optic device, at least part of a pyroelectric device, or at least part of a guided photonic device. In particular, it may form a RF filter, a waveguide or an optical modulator.

6

For clarity sake, element sizes which appear in these figures do not correspond to actual dimensions or dimension ratios. Also, same reference numbers which are indicated in these figures denote identical elements of elements with identical function.

DETAILED DESCRIPTION

Figure 1:
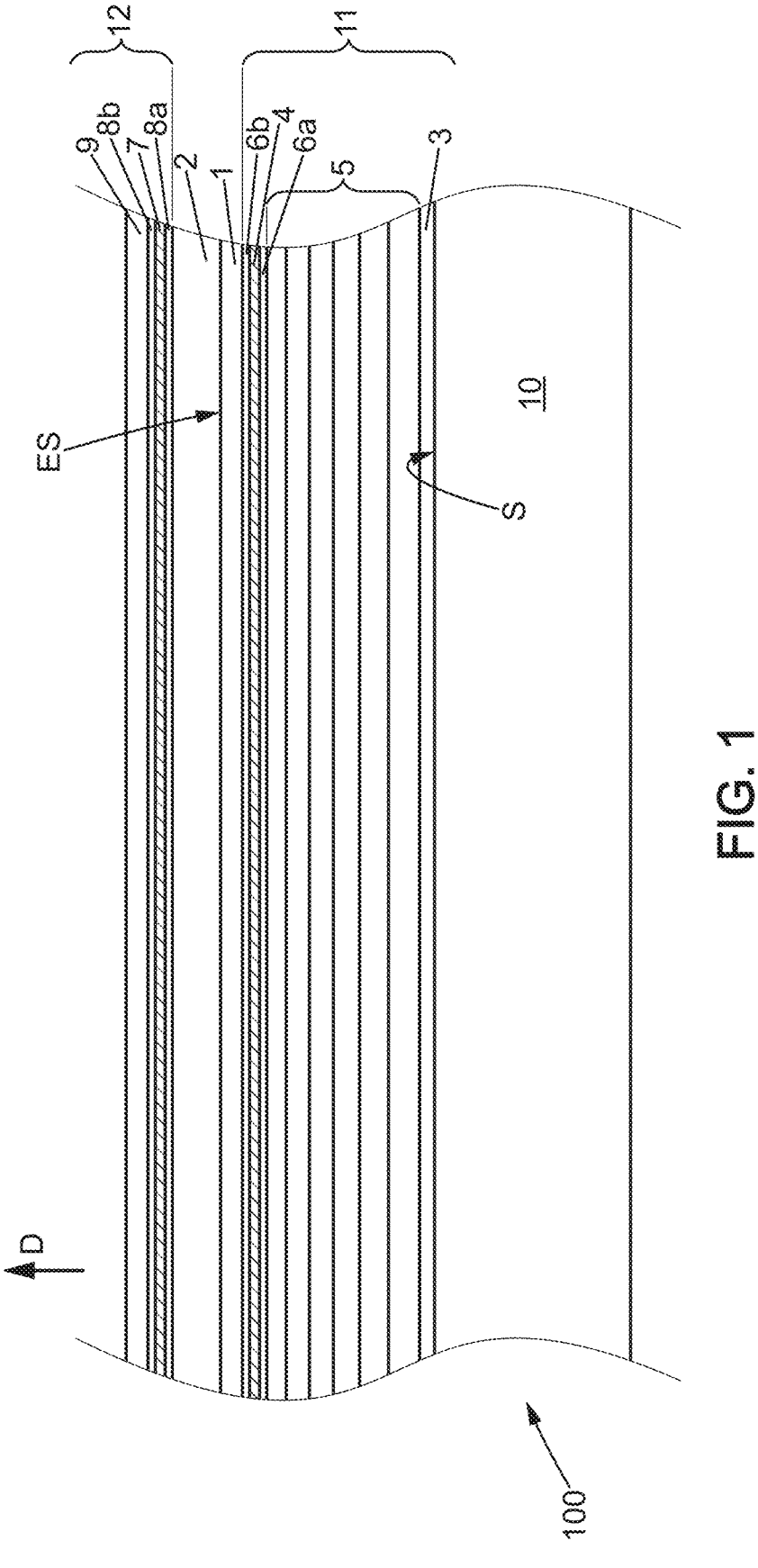
FIG. 1 is a cross-section of a layered solid element in accordance with the present invention.

With reference to FIG. 1, a layered solid element 100 comprises a substrate 10 which has an upper face S, and a layer stack which is arranged on this upper face S. Therefore, a stacking direction D of the layer stack is perpendicular to the upper substrate face S. For example, the substrate 10 may be a portion of a (100)-single-crystal silicon wafer.

The layer stack comprises a buffer layer 1 and a ferroelectric layer 2 which are in direct contact with one another along an intermediate epitaxial interface ES. The orientation of layer 2 is defined by the orientation of layer 1. Both layers 1 and 2 are crystalline with crystal structure of R-3c and R3c space group, respectively. Layer 1 may be a Ruddlesden-Popper phase with tetragonal or orthorhombic structure. The epitaxial interface ES is perpendicular to the stacking direction D, and parallel to the upper substrate face S. For example, the buffer layer 1 may be 15 nm thick, and the ferroelectric layer 2 may be 250) nm thick, these thicknesses being measured parallel to the stacking direction D. The buffer layer 1 may be of crystalline lanthanum nickelate, with chemical formula $LaNiO_3$, and the ferroelectric layer 2 may be of lithium niobate, with chemical formula $LiNbO_3$, or lithium tantalate, with chemical formula $LiTaO_3$. But the Li-content of the ferroelectric layer 2 may vary in some extent, and also the material of the ferroelectric layer 2 may be $LiNbO_3$ with some of the niobium cations replaced by tantalum cations without disturbing the crystal structure. The oxygen amount in the buffer layer 1 and ferroelectric layer 2 may also vary in some extent.

The layer stack may further comprise a lower stack part 11 which is situated between the upper substrate face S and the buffer layer 1, and also an upper stack part 12 situated on a side of the ferroelectric layer 2 opposite the substrate 10.

Figure 3A:
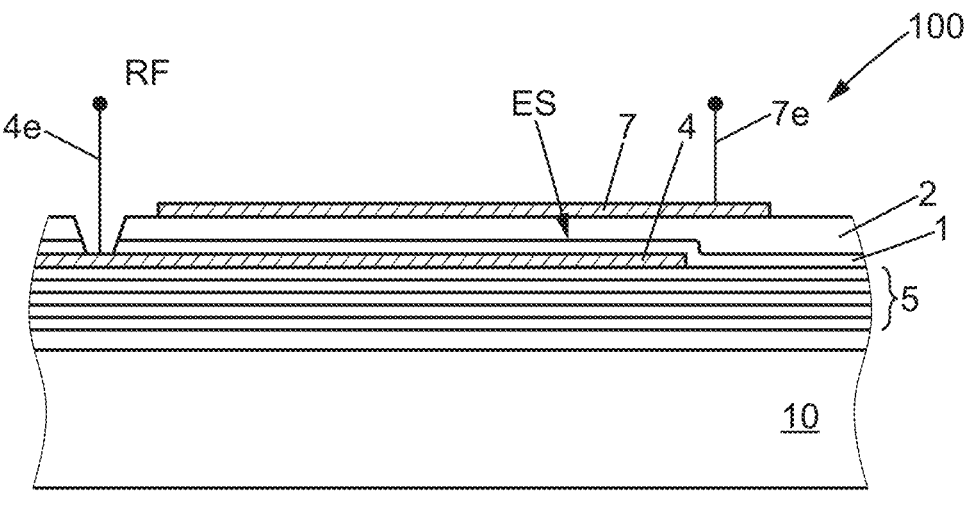
FIGS. 3a and 3b are cross-sectional views of two layered solid elements according to the invention and having SMR and TFBAR structures, respectively.
Figure 3B:
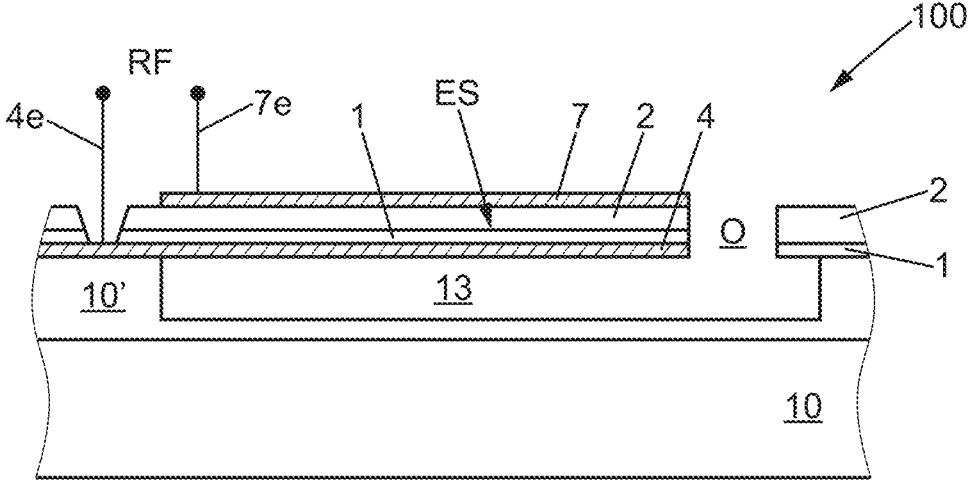

A first layer 3 of the lower stack part 11 may be a silica $(SiO_2)$ layer, for example formed by thermal oxidation of the substrate 10) when in silicon. The lower stack part 11 may further comprise a number of individual layers, including for example a bottom electrode layer 4, for example of platinum-, iridium- or ruthenium-based material, oxide layers such as ruthenia $(RuO_2)$ or cerium oxide $(CeO_2)$, indium tin oxide (ITO), and also possibly a layer subset 5 which is suitable for forming an acoustic Bragg mirror or optical Bragg mirror. In a known manner, such Bragg mirror is designed for reflecting bulk acoustic waves or optical waves produced within the ferroelectric layer 2. Possibly, the lower stack part 11 may also comprise a sacrificial layer, which is intended to be etched later in the manufacturing process to form a thin film bulk acoustic resonator, commonly denoted as TFBAR. Such structures that are compatible with the invention layered solid element will be described further below, in particular with reference to [FIG. 3a] and [FIG. 3b]. The lower stack part 11 may additionally comprise one or several adhesion layers, which may be based on chromium, chromium oxide, titanium, titanium oxide, tantalum, tantalum oxides, metal alloys, etc. Implementation of such adhesion layers is well-known in the art, so that it is useless to describe them further here. In FIG. 1, two adhesion layers 6a and 6b are represented on each side of the bottom electrode layer 4, but usually only layer 6a is sufficient.

Layer 6b may be used to prevent diffusion from the buffer layer 1 or ferroelectric layer 2, in particular diffusion of lithium oxide, to the electrode layer 4 or to in general to the layer subset 5.

The upper stack part 12 may also comprise one or several individual layers, including a top electrode layer 7, other adhesion layers 8a and 8b, and a protection layer or temperature compensation layer 9. The top electrode 7 may be of the same material as that of the bottom electrode layer 4, or of aluminium-, tungsten-, molybdenum- or gold-based materials, or be based on other metals. The layer 9 may be of silicon oxide, aluminium oxide or some other dielectric material, for example.

Layers other than the buffer layer 1 and the ferroelectric layer 2 are not described further since they do not relate directly to the invention. The actual composition of the layered solid element 100 may differ from that recited just above depending on its application. In particular, for applications other than RF-filters and optical modulators, such as energy harvesting, electrically conducting oxides, including doped oxides, may be used as electrode layer materials.

The layered solid element 100 may be part of an integrated circuit, such as an integrated electronic device, part of an integrated acoustic device, or part of an integrated guided photonic device. For an integrated electronic device, the substrate 10 may incorporate or support electrical components and connections in a well-known manner, and the layered solid element 100 with the arrangement as represented in [FIG. 1] may constitute a solidly mounted resonator, commonly denoted SMR. Alternatively, for an integrated guided photonic device, the substrate 10 incorporates or supports waveguide segments (not represented) that are arranged in a suitable manner for injecting radiation into the ferroelectric layer 2 and collecting radiation exiting therefrom. For example, for such optical application, the layered solid element 100 may constitute an optical modulator.

Figure 2:
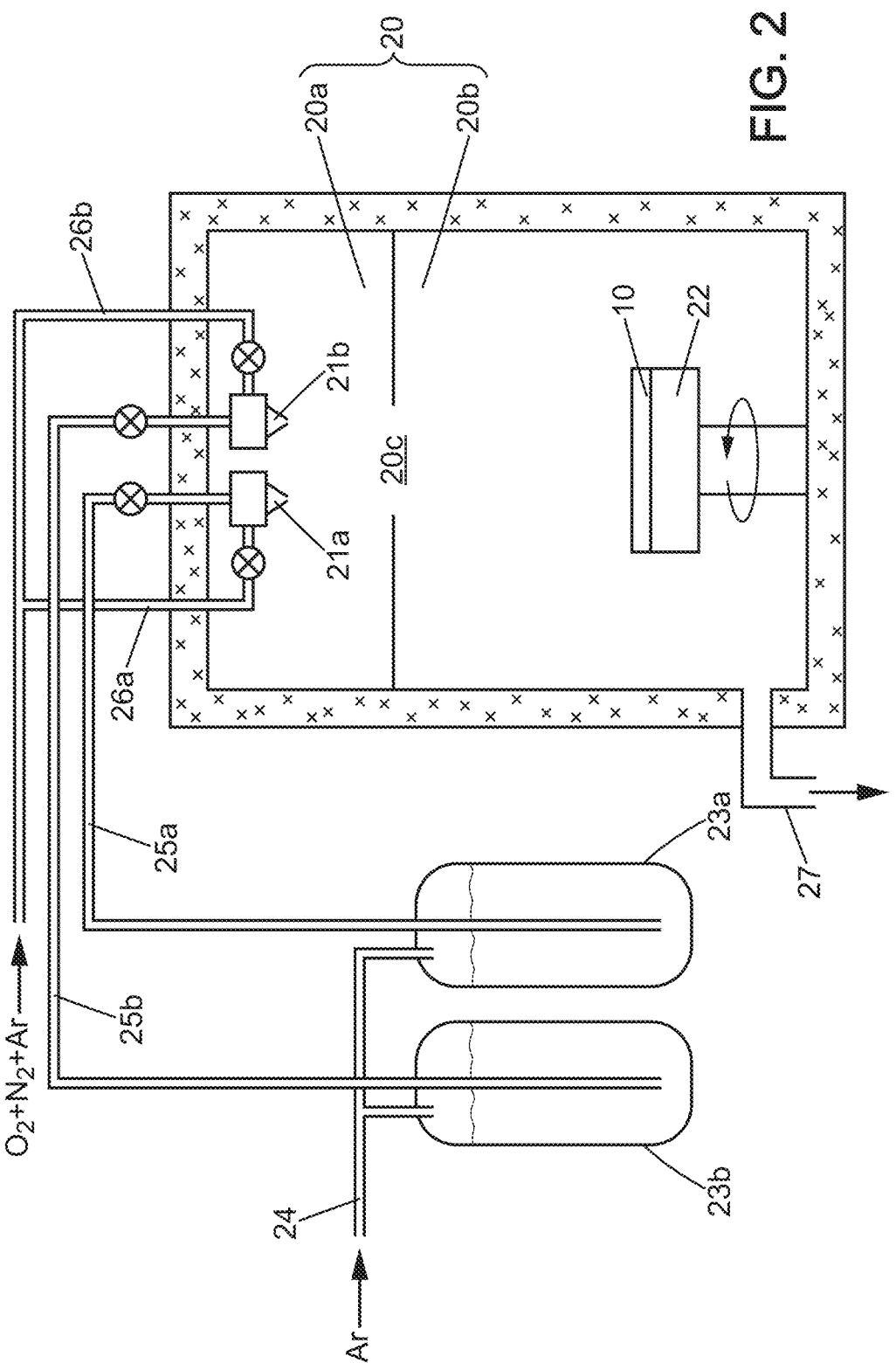
FIG. 2 represents schematically a material deposition assembly which may be used for depositing the ferroelectric layer of the layered solid element of FIG. 1.

Turning now to FIG. 2, a CVD-reactor suitable for depositing at least the ferroelectric layer 2, or the succession of the buffer layer 1 and the ferroelectric layer 2, is described. This CVD-reactor is of the type commonly known as DLI-CVD, for Direct Liquid Injection Chemical Vapour Deposition, but other types may be used alternately, such as PI-CVD for Pulsed Injection Chemical Vapour Deposition, for example. The DLI-CVD reactor comprises a low-pressure temperature-controlled vessel 20, which may be comprised of two chambers 20a and 20b with a gas passage 20c therebetween. The chamber 20a is designed for vaporizing chemical precursors, and the chamber 20b is designed for making these precursors to react chemically on the substrate 10 in order to form the desired layer. Two double-injectors 21a and 21b may be provided to feed the chamber 20a with the following respective mixtures when the ferroelectric layer 2 is to be deposited: a liquid organic solution which contains a first metal-organic compound as a lithium (Li) precursor with a gaseous mixture of oxygen ($O_2$), nitrogen ($N_2$) or argon (Ar) for the injector 21a, and another liquid organic solution which contains another metal-organic compound as a niobium (Nb) or tantalum (Ta) precursor for the injector 21b with the same gaseous mixture as for the injector 21a. A single injector may be used alternatively in the case of a liquid organic solution which contains a mixture of all the metal-organic compounds forming the lithium-(Li), niobium-(Nb) or tantalum-(Ta) precursors with a gaseous mixture of oxygen ($O_2$), nitrogen ($N_2$) or argon (Ar). Reference 23a denotes a sealed tank which contains the Li-precursor, for example (2,2,6,6-tetramethyl-3,5-heptanedione) Li dissolved in 3,3,5-trimethyl benzene, also called mesitylene, and N,N,N',N'-tetramethylethylenediamine (TMEDA) and pressurized with argon or nitrogen through pipe 24. The double injector 21a is connected to the tank 23a through the pipe 25a and supplied with the oxygen-nitrogen-argon mixture through the pipe 26a. Similarly, Reference 23b denotes another sealed tank which contains the Nb- or Ta-precursor, for example (2,2, 6,6-tetramethyl-3,5-heptanedione)$_4$Nb or (2,2,6,6-tetramethyl-3,5-heptanedione)$_4$Ta also dissolved in mesitylene and TMEDA. Then, the double injector 21b is connected to the Ar-pressurized tank 23b through the pipe 25b and supplied with the oxygen-nitrogen-argon mixture through the pipe 26b. Suitable heating modules (not represented) are incorporated in the walls of the chambers 20a and 20b and inside the substrate support 22 for producing desired temperature values, and an exhaust 27 of the chamber 20b is connected to a pumping device (not represented).

The chamber 20b encloses a substrate support 22 on which the substrate 10 is to be fixed. The support 22 may be optionally provided with a spinning mechanism, for producing deposited layers with improved thickness uniformity across a large useful deposition area. In particular, it is possible in this way to process large area substrates which are intended to be cut into separate integrated circuits later on.

According to first embodiments of the invention, the substrate 10 is already provided with the lower stack part 11 if any and the buffer layer 1, before being CVD-processed. The buffer layer 1, of crystalline $LaNiO_3$, may have been deposited using the well-known RF-sputtering process, leading to crystal orientation with crystallographic R-planes (0, 1, −1, 2) in hexagonal setting which are parallel to the upper substrate face S, also called 36° Y crystal orientation in IEEE convention. Suitable sputtering conditions for deposition of such buffer layer 1 may be: $LaNiO_3$ as sintered target material, deposition temperature between 350° C. (degree Celsius) and 600° C., target power between 50 W (watt) and 200 W, chamber pressure between $3 \cdot 10^{-3}$ Torr and $6 \cdot 10^{-3}$ Torr, and oxygen/argon ratio between less than 50%. Using $La_{n+1}Ni_nO_{3n+1+\delta}$ target, the same deposition conditions will allow the growth of $La_{n+1}Ni_nO_{3n+1+\delta}$ layers with crystallographic plane (0, 0, 1) parallel to the upper substrate face S.

For these first embodiments, the ferroelectric layer 2 may be deposited directly on the buffer layer 1 using the DLI-CVD reactor of FIG. 2 with the following deposition parameters: temperature inside the vaporization chamber 20a between 250° C. and 270° C., temperature inside the deposition chamber 20b between 600° C. and 700° C., pressure inside the deposition chamber 20b between 2 Torr and 10 Torr, and ratio $O_2/(O_2+N_2+Ar)$ between 30% and 50%. These deposition parameters produce a growth rate for the ferroelectric layer 2 of between 0.5 nm/min (nanometer per minute) and 2 nm/min parallel to the stacking direction D. The $LiNbO_3$ material thus deposited for forming the ferroelectric layer 2 is crystalline, with 33°Y orientation induced through epitaxy by the 36° Y-orientation of the $LaNiO_3$ material in the buffer layer 1.

If tantalum is to used instead of niobium partly or totally in the ferroelectric layer 2, the niobium precursor should be combined with or replaced by the tantalum precursor when supplying the CVD-vessel with the chemical compounds. Such adaptation can be carried out easily by the Man skilled in material deposition, since the deposition parameters provided above for the $LiNbO_3$ composition also suit for the $LiTaO_3$ composition.

According to second embodiments of the invention, both the buffer layer 1 and the ferroelectric layer 2 may deposited successively using DLI-CVD reactors as shown in FIG. 2. The following deposition conditions may be used for the $LaNiO_3$ material of the buffer layer 1 in the CVD reactor which is dedicated to this layer: (2,2,6,6-tetramethyl-3,5-heptandione)$_3$La dissolved mesitylene-TMEDA as lanthanum precursor in the tank 21$a$, (2,2,6,6-tetramethyl-3,5-heptandione) 2Ni dissolved in mesitylene-TMEDA as nickel precursor in the tank 21$b$, temperature inside the vaporization chamber 20$a$ between 185° C. and 215° C., temperature inside the deposition chamber 20$b$ between 650° C. and 775° C., gas mixture of oxygen, nitrogen and argon with ratio $O_2/(O_2+N_2+Ar)$ between 30% and 50%, and pressure inside the deposition chamber 20$b$ between 2 Torr and 10 Torr. Adjusting La and Ni precursor ratio in the solution at the same deposition conditions will enable the growth of $La_{n+1}Ni_nO_{3n+1+\delta}$ layers with crystallographic plane (1, 1, 0) parallel to the upper substrate face S. These deposition conditions produce a growth rate for the buffer layer 1 of between 0.5 nm/min and 1 nm/min. The $LaNiO_3$ material thus deposited for forming the buffer layer 1 is crystalline, with X-orientation and $La_{n+1}Ni_nO_{3n+1+\delta}$ layers with (1, 1, 0)) orientation. This means that the X-axis of the crystal structure of $LaNiO_3$ is perpendicular to the substrate face S.

For such second embodiments, the ferroelectric layer 2 is CVD-deposited directly on the buffer layer 1 thus obtained. The CVD-deposition parameters listed above for the $LiNbO_3$ material in the first embodiments may be used again for the second embodiments. But now, due the X-orientation of the $LaNiO_3$ material of the buffer layer 1, the $LiNbO_3$ material of the ferroelectric layer 2 is obtained through epitaxy with crystal orientation X, meaning that the X-axis of the crystal structure of $LiNbO_3$ is perpendicular to the epitaxy interface ES, and also that the (2, –1, –1, 0) A-planes of $LiNbO_3$ are parallel to the epitaxial interface ES.

Alternatively, the $LaNiO_3$ material deposited for forming the buffer layer 1 may be crystalline with 36° Y-orientation if the substrate 10 or lower stack part 11 imposes epitaxial growth of (0, 1, –1, 2) planes of $LaNiO_3$ parallel to the epitaxial interface.

Also possibly, the $LaNiO_3$ material deposited for forming the buffer layer 1 may be crystalline with X-orientation if the substrate 10 or lower stack part 11 imposes epitaxial growth of (2, –1, –1, 0) planes of $LaNiO_3$ parallel to the epitaxial interface.

When the $L_{n+1}Ni_nO_{3n+1+\delta}$ material is deposited for forming the buffer layer 1, it may be crystalline with (0, 0, 1)-orientation if the substrate 10 or lower stack part 11 imposes epitaxial growth of (0, 0, 1) planes of $L_{n+1}Ni_n$ $O_{3n+1+\delta}$ parallel to the epitaxial interface. The $L_{n+1}Ni_n$ $O_{3n+1+\delta}$ material deposited for forming the buffer layer 1 may also be crystalline with (1, 1, 0)-orientation if the substrate 10 or lower stack part 11 imposes epitaxial growth of these planes of $L_{n+1}Ni_nO_{3n+1}+\delta$ parallel to the epitaxial interface.

The ferroelectric layers 2 that have been obtained in such first and second embodiments exhibit large piezoelectric and electro-optic efficiencies due to their 33°Y-orientation or X-orientation. Thanks to such piezoelectric and electro-optic efficiencies, the integrated devices that incorporate the layered solid element 100 allows improved operation and/or larger frequency operation band, whatever the application of this device, in particular RF-filtering and optical modulation.

For all embodiments of the invention, an electrical poling step may be necessary for aligning varying polarisations which may exist in domains within the ferroelectric layer 2 as-deposited. Such poling may be achieved by applying an electrical field to the layer 2, which is higher that a coercive electrical field. Such electrical field may be applied to the ferroelectric layer 2 during deposition of this latter, so that the as-deposited ferroelectric material has one single polarization throughout the whole layer 2. Alternatively, the electrical poling may be carried out after the ferroelectric layer 2 or the whole layered solid element 100 has been completed. For implementing such poling, one or both of the electrode layers 4 and 7 may be used for electrical connection to an external voltage source. For example, when the coercive electrical field of the ferroelectric material of layer 2 equals 85 kV/cm (kilovolt per centimetre), the poling electrical field to be used may be more than 85 kV/cm.

The invention layered solid element 100 may be combined with various element structures including high overtone bulk acoustic resonator, or HBAR, bulk acoustic wave solid mounted resonator, or SMR, or thin film bulk acoustic resonator of free-standing type, denoted TFBAR.

For the HBAR structure, the lower stack part 11 is devoid of acoustic Bragg mirror 5, so that the substrate 10 forms the propagation medium of the acoustic waves.

For the SMR structure as shown in [FIG. 3$a$], the lower stack part 11 includes the acoustic Bragg mirror 5, so that the propagation medium of the acoustic waves is limited to the stack part that is located above the Bragg mirror 5, opposite the substrate 10. This propagation medium is thus formed by the lower electrode 4, the buffer layer 1, the ferroelectric layer 2 and the upper electrode 7, and it is isolated from the substrate 10 by the acoustic Bragg mirror 5. [FIG. 3$a$] also shows electrode connections 4$e$ and 7$e$ that are intended to be connected to an electrical signal source, such as a RF source.

For the TFBAR structure as shown in [FIG. 3$b$], the lower stack part 11 includes initially a layer of sacrificial material. This sacrificial material is then etched through an aperture O, after the lower electrode 4, the buffer layer 1, the ferroelectric layer 2 and the upper electrode 7 have been deposited. Reference number 10' denotes a surrounding material portion that may be of silica. Dry or wet etching processes may be implemented for withdrawing the sacrificial material selectively with respect to the other materials. A cavity 13 is thus created between the lower electrode 4 and the substrate 10. The acoustic propagation medium is formed again by the lower electrode 4, the buffer layer 1, the ferroelectric layer 2 and the upper electrode 7, but it is isolated from the substrate 10 by the cavity 13 instead of the acoustic Bragg mirror 5.

When the invention layered solid element 100 is intended to form a guided photonic device, it may be either devoid of layer subset 5, or the layer subset 5 may be an optical Bragg mirror.

Figure 4:
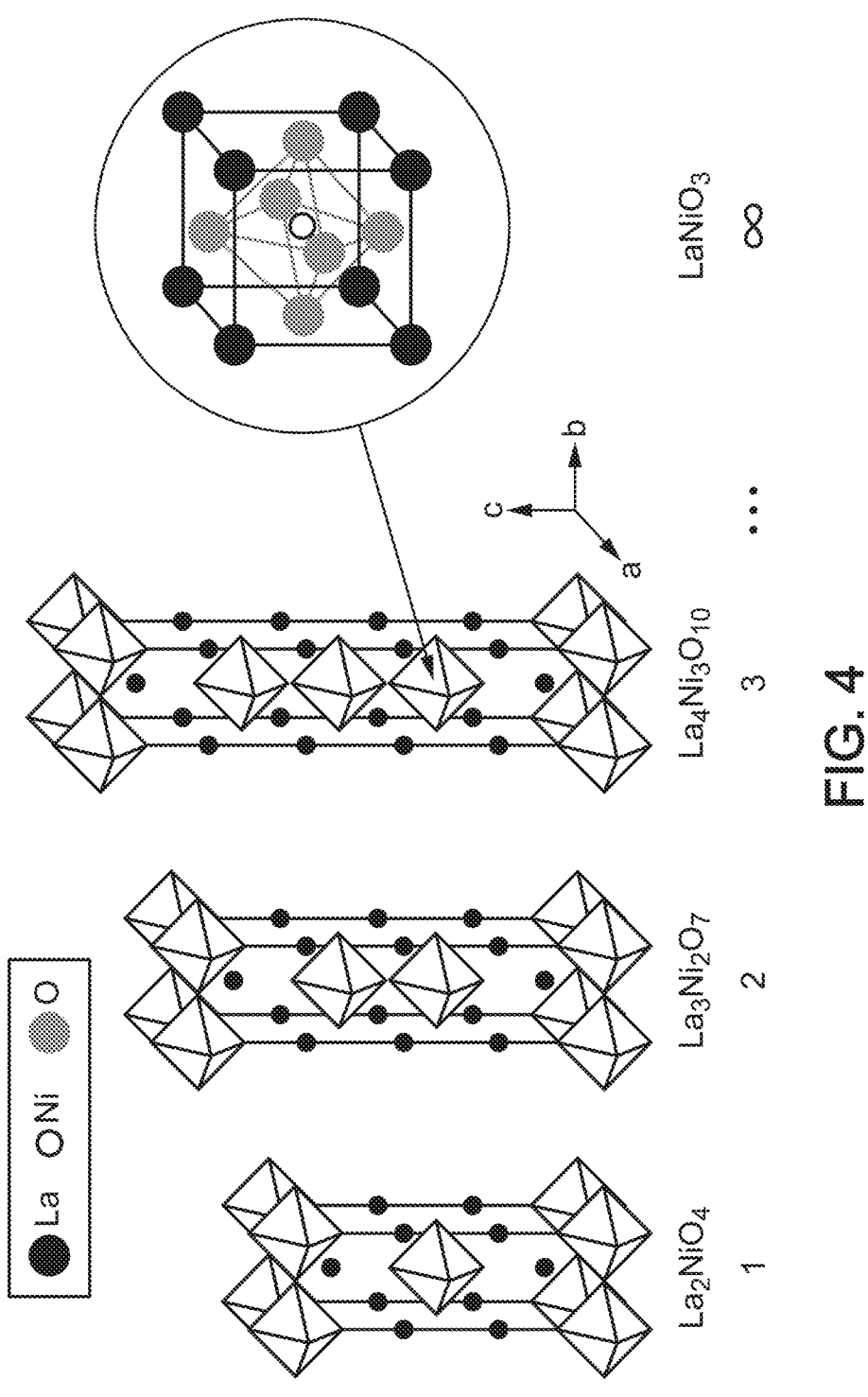
FIG. 4 shows crystalline structures of compounds that can be used for the buffer layer in a layered solid element according to the invention.

The buffer layer 1 may have one of the chemical compositions $L_kNi_rO_{1.5 \cdot (k+r)+w}$, where L is the lanthanide element or several lanthanide elements substituted to one another, $0.7 \leq k \leq 1.3$, $0.7 \leq r \leq 1.3$ and $-0.5 \leq w \leq +0.5$. But it may alternatively have one of the other chemical compositions $L_{n+1}Ni_nO_{3n+1+\delta}$, where n is a non-zero integer, and $-0.5 \leq \delta \leq +0.5$. For n=1, the compound is $La_2NiO_4$ with $K_2NiF_4$ structure, and for n very large, it is close to $LaNiO_3$ with perovskite structure. Such other compositions are known as Ruddlesden-Popper phases and the $L_2NiO_4$ crystal structure can be derived by alternating along [001] crystallographic direction of $LNiO_3$ perovskite blocks and LaO layers rotated by 45° in the basal plane of tetragonal cell. [FIG. 4] illustrates such derivation of the $La_{n+1}Ni_nO_{3n+\epsilon}$ compositions from $La_2NiO_4$. In each one of the compositions $L_kNi_rO_{1.5 \cdot (k+r)+w}$ and $L_{n+1}Ni_nO_{3n+1+\delta}$, L may indicate a mixture of several lanthanide elements provided that the compositions thus obtained for the buffer layer can be deposited in crystal forms which allow subsequent deposition of the ferroelectric material with X- or ≈33° Y-orientation through epitaxy from the buffer layer.

It is also reminded that the ferroelectric material may be varied in chemical composition in a great extent while maintaining both its ferroelectric efficiency and its epitaxial growth capability from the buffer layer. For this reason, a general composition of the ferroelectric layer 2 which is implemented according to the invention can be expressed as $Li_{1-x}(Nb_{1-y}Ta_y)_{1+x}O_{3+2x-z}$, with $0 \leq x \leq 0.08$, $0 \leq y \leq 1$ and $0 \leq z \leq 0.5$.

Finally, all details in the design of the CVD-reactor which have been provided as well as all cited numeral values are for exemplifying purpose only, and may be adapted depending on the reactor actually used, the exact chemical compositions implemented and the desired growth rates and layer thicknesses.

The invention claimed is:

1. A layered solid element comprising a substrate and a layer stack supported by a face of the substrate, the layer stack comprising a buffer layer of a first crystalline material and a ferroelectric layer of a second crystalline material which are in direct contact with one another along an epitaxial interface, the buffer layer being closer to the substrate than the ferroelectric layer, wherein the first crystalline material is based on a first compound with chemical formula $L_kNi_rO_{1.5 \cdot (k+r)+w}$, where L is a lanthanide element or several lanthanide elements substituted to one another within said first crystalline material, Ni is nickel and O is oxygen, k is a first coefficient comprised between 0.7 and 1.3, r is a second coefficient comprised between 0.7 and 1.3, and w is a third coefficient comprised between −0.5 and +0.5, or the first crystalline material is based on another first compound chemical with formula $L_{n+1}Ni_nO_{3n+1+\delta}$, where n is a non-zero integer, and δ is a coefficient comprised between −0.5 and +0.5, and the second crystalline material is based on lithium nobate, lithium tantalate or a second compound with chemical formula $Li_{1-x}(Nb_{1-y}Ta_y)_{1+x}O_{3+2x-z}$, where Li is lithium, Nb is niobium, Ta is tantalum, x is another first coefficient comprised between 0 and 0.08, y is another second coefficient comprised between 0 and 1, and z is another third coefficient comprised between 0 and +0.5.

2. The layered solid element according to claim 1, wherein the second crystalline material is of ilmenite structure with a trigonal structure, and the buffer layer of the first crystalline material is based on $L_kNi_rO_{1.5 \cdot (k+r)+w}$ with a trigonal structure, and has a crystallographic plane (0, 1, −1, 2) in hexagonal setting that is parallel to the epitaxial interface, and the second crystalline material within the ferroelectric layer is oriented 33°±5° Y in IEEE convention with respect to said epitaxial interface, or the buffer layer of the first crystalline material is based on $L_kNi_rO_{1.5 \cdot (k+r)+w}$ with a trigonal structure and has a crystallographic plane (1, 1, −2, 0) in hexagonal setting that is parallel to the epitaxial interface, and the second crystalline material within the ferroelectric layer has a crystallographic X-axis oriented perpendicular to said epitaxial interface in IEEE convention, or the buffer layer of the first crystalline material is based on $L_{n+1}Ni_nO_{3n+1+\delta}$ with a tetragonal or a orthorhombic structure and has a crystallographic plane (0, 0, 1) that is parallel to the epitaxial interface, and the second crystalline material within the ferroelectric layer is oriented 33°±5° Y in IEEE convention with respect to said epitaxial interface, or the buffer layer of the first crystalline material is based on $L_{n+1}Ni_nO_{3n+1+\delta}$ with a tetragonal or a orthorhombic structure and has a crystallographic plane (1, 1, 0) that is parallel to the epitaxial interface, and the second crystalline material within the ferroelectric layer has a crystallographic X-axis oriented perpendicular to said epitaxial interface in IEEE convention.

3. The layered solid element according to claim 1, wherein the buffer layer has a first thickness of between 1 nm and 1000 nm, and the ferroelectric layer has a second thickness of between 10 nm to 2000 nm, said first and second thicknesses being measured perpendicular to the epitaxial interface.

4. The layered solid element according to claim 1, wherein the substrate is a silicon-based substrate or a substrate designed for an integrated optical or acoustical device.

5. The layered solid element according to claim 1, wherein the layer stack further comprises at least one among a silica layer, a titanium layer, a titania layer, a tantalum layer, a tantalum oxide layer, a chromium layer, a chromium oxide layer, an electrode layer, a sacrificial layer adapted to be selectively etched and a Bragg mirror, between the substrate and the buffer layer.

6. The layered solid element according to claim 1, wherein a cavity is located between a first part of said layered solid element which comprises the substrate, and a second part of said layered solid element which comprises the buffer layer and the ferroelectric layer.

7. The layered solid element according to claim 1, wherein the ferroelectric layer is located between two electrode layers within the layer stack, along a direction perpendicular to the ferroelectric layer and the two electrode layers, so that the layered solid element is adapted to implement bulk acoustic waves or optical variations that are generated within said ferroelectric layer by a time-varying voltage applied between said two electrode layers.

8. The layered solid element according to claim 1, forming part of an integrated electronic circuit, an integrated acoustic device, an integrated guided photonic device or a pyroelectric device.

9. A method for manufacturing the layered solid element that is in accordance with claim 1, wherein the second crystalline material is grown epitaxially from the buffer layer of said first crystalline material, for forming the ferroelectric layer.

10. The method according to claim 9, wherein the first crystalline material is deposited using a RF-sputtering deposition process or a chemical vapour deposition process, for forming the buffer layer.

11. The method according to claim 9, wherein the second crystalline material is deposited using a chemical vapour deposition process, for forming the ferroelectric layer.

12. The method according to claim 11, wherein the chemical vapour deposition process is a direct-liquid-injection chemical vapour deposition process or a pulsed-injection chemical vapour deposition process.

13. The method according to claim 9, further comprising applying an electrical field to the second crystalline material when said second crystalline material is being deposited for forming the ferroelectric layer, or after said second crystalline material has been deposited, the electrical field being suitable for aligning ferroelectric orientations existing in domains within the ferroelectric layer.

14. An integrated circuit, comprising a layered solid element that is in accordance with claim 1, said integrated circuit forming at least part of an electronic device, at least part of an acoustic device, at least part of a microacoustic device, at least part of an electro-optic device, at least part of a pyroelectric device, or at least part of a guided photonic device.

15. The integrated circuit according to claim 14, forming a RF-filter, a waveguide or an optical modulator.

* * * * *